United States Patent
Aquien et al.

(10) Patent No.: US 6,828,671 B2
(45) Date of Patent: Dec. 7, 2004

(54) ENHANCED BGA GROUNDED HEATSINK

(75) Inventors: Weddie Aquien, Singapore (SG); John Briar, Singapore (SG); Setho Sing Fee, Singapore (SG)

(73) Assignee: ST Assembly Test Services PTE LTD, Singapore (SG)

( * ) Notice: Subject to any disclaimer, the term of this patent is extended or adjusted under 35 U.S.C. 154(b) by 29 days.

(21) Appl. No.: 10/323,447

(22) Filed: Dec. 19, 2002

(65) Prior Publication Data

US 2003/0085462 A1 May 8, 2003

Related U.S. Application Data

(62) Division of application No. 09/849,671, filed on May 7, 2001, now Pat. No. 6,537,857.

(51) Int. Cl.[7] .......................... H01L 23/10; H01L 23/34
(52) U.S. Cl. ........................ 257/706; 257/713; 257/712
(58) Field of Search ................................. 257/706, 712, 257/713, 717

(56) References Cited

U.S. PATENT DOCUMENTS

| | | | |
|---|---|---|---|
| 5,376,909 A | 12/1994 | Nelson et al. | 333/247 |
| 5,409,865 A * | 4/1995 | Karnezos | 29/827 |
| 5,739,581 A | 4/1998 | Chillara et al. | 257/668 |
| 5,914,859 A * | 6/1999 | Takada et al. | 361/704 |
| 6,011,299 A | 1/2000 | Brench | 257/660 |
| 6,057,601 A * | 5/2000 | Lau et al. | 257/738 |
| 6,395,582 B1 * | 5/2002 | Sohn et al. | 438/111 |

* cited by examiner

Primary Examiner—David A. Zarneke

(57) ABSTRACT

A new method is provided for the establishment of a low resistivity connection between a wire bonded IC chip that is mounted on a heatsink and the heatsink of the package. A copper trace connection is allocated for this purpose on the surface of the substrate layer to which the IC chip is connected. An opening is provided in the substrate layer of the package, this opening aligns with the copper trace that has been allocated for establishing a ground connection and penetrates the substrate layer down to the surface of the underlying heatsink. The opening is filled with a conductive epoxy or an equivalent low-resistivity material thereby establishing a direct electrical connection or short between the allocated copper trace and the underlying heatsink. By connecting the ground point of the IC chip to the allocated copper trace, a direct electrical low resistivity connection is made between the ground point of the IC chip and the heatsink into which the IC chip is mounted.

22 Claims, 2 Drawing Sheets

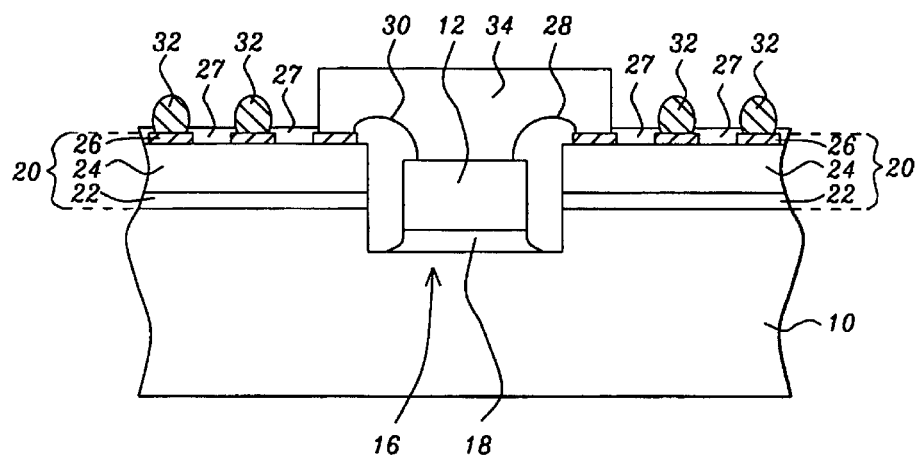
*FIG. 1 – Prior Art*
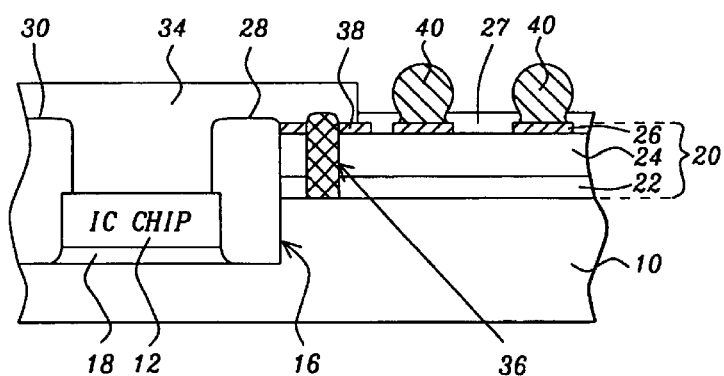
*FIG. 2a*

ENHANCED BGA GROUNDED HEATSINK

This is a division of patent application Ser. No. 09/849,671, filing date May 7, 2001 now U.S. Pat. No. 6,537,857, Enhanced BGA Grounded Heatsink, assigned to the same assignee as the present invention.

BACKGROUND OF THE INVENTION (1) Field of the Invention

The invention relates to the fabrication of integrated circuit devices, and more particularly, to a method for grounding an enhanced BGA package to an underlying heatsink.

(2) Description of the Prior Art

The semiconductor industry has for many years followed a path of product improvement by the electrically required approach of device miniaturization and by the therefrom following increase of the device packaging density. For many of the semiconductor devices, increased device density is implemented internally to the device by creating device features of smaller dimensions. Where these devices need to be assembled into complete device packages, the completed semiconductor devices are frequently assembled in multi-device packages. This has led to the field of high density interconnect technology, where multilayer structures are mounted on the surface of a substrate thereby connecting integrated circuits to one another. This approach results in high wiring and high packaging density, whereby many integrated circuit chips are physically and electrically interconnected and connected to a single substrate commonly referred to as a Multi-Chip-Module (MCM). Electrical device isolation is provided by layers of dielectric such as polyimide that separate various functional planes (such as signal lines, power lines and ground planes) in the substrate. Metal interconnects can readily be provided by metal lines that are embedded in other layers of dielectric, thereby using vias (holes) to provide electrical connections between the various types of lines. Interconnect lines must thereby be connected in such a manner that optimum performance can be realized for the completed package. For instance, adjacent layers must be formed such that primary signal propagation directions are orthogonal to each other. This to avoid crosstalk between lines that are in close physical proximity, which can induce false signals and noise between adjacent lines. Good planarity must also be maintained between adjacent layers of interconnect lines because the metal interconnect lines are typically narrow in width and thick in a vertical direction (in the range of 5 to 10 microns thick) and must be patterned with microlithography. Patterned layers must therefore be substantially flat and smooth (i.e. have good planarity) so that these layers can serve as a base for the next layer.

One of the original approaches that has been used to create surface mounted, high pin count integrated circuit packages has been the use of Quad Flat Packs (QFP's) with various pin configurations. For QFP's, closely spaced leads along the four edges of the flat package are used for making electrical connections from where the electrical connections are distributed to the surrounding circuitry. The input/output (I/O) connections that can be made to QFP's are therefore confined to the edges of the flat package, which limits the number of I/O connections that can be made to the QFP even in applications where the pin to pin spacing is small. QFP's have found to be cost effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package thereby eliminating the restriction of having I/O connects only around the periphery of the package. More contact points with greater spacing between the contact points can therefore be allocated across the BGA package than was the case with the QFP's. The contact points that are used for the BGA package are typically solder balls that have the added advantage of facilitating flow soldering of the package onto a printed circuit board.

A Ball Grid Array (BGA) is an array of solderable balls placed on a chip carrier, such as a Printed Circuit Board (PCB). The balls contact a printed circuit board in an array configuration where, after reheat, the balls connect the chip to the printed circuit board. BGA's are known with 40, 50 and 60 mils spacings in regular or staggered array patterns. The BGA package is part of a larger packaging approach that is often referred to as Chip Scale Packages (CSP), which is a packaging approach that is considered to be different from the previously highlighted approach of MCM's.

Flip Chip packages have in general been used to accommodate increased I/O count combined with increased high requirements for high performance IC's. Flip chip technology fabricates bumps (typically Pb/Sn solder) on Al pads and interconnects the bumps directly to the package media, which are usually ceramic or plastic based. The flip-chip is bonded face down to the package through the shortest paths. This approach can be applied to single-chip packaging and to higher integrated levels of packaging (in which the packages are larger) and to more sophisticated packaging media that accommodate several chips to form larger functional units.

Prior Art substrate packaging uses ceramic and plastic BGA packaging. Ceramic substrate packaging is expensive and has proven to limit the performance of the overall package. Recent years have seen the emergence of plastic BGA packaging; this packaging has become the main stream design and is frequently used in high volume BGA package fabrication. The plastic substrate BGA package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the plastic structure becomes complicated and expensive.

It is therefore the objective of providing a package for flip chips that has a direct ground connect between the flip chip and a heatsink on the surface of which the flip chip is mounted. In a typical flip chip packaging arrangement, a substrate layer that contains three layers is used to connect the flip chip to surrounding circuitry, using wire bond connections between the flip chip and the substrate layer. The contact points of the BGA/flip chip make contact with contact points in the top surface of the substrate layer, the substrate layer re-distributes (fan-out) the BGA/flip-chip contact points. An opening is provided in each of the three layers that are contained in the substrate layer, this opening is filled with a low-resistivity material thus establishing electrical contact between one selected copper pad of the copper traces (in the upper layer of the substrate layer) and the heatsink. Connecting the ground point of the IC die to the selected copper pad of the copper traces completes the ground path between the ground of the IC die and the heatsink. A molding is encased between the lower surface of the BGA/flip-chip device and the upper surface of the substrate. This molding is referred to as underfill since it is filled in under the original BGA/flip-chip device. A heat sink is typically attached to the lower surface of the flip-chip.

FIG. 1 shows a Prior Art method of packaging a BGA/flip chip whereby a major part of the package contains a heatsink 10. The semiconductor chip or die 12 takes up the center of the package; the contact points of die 10 are closely spaced around the periphery of the die 10. Cavity 16 is provided in the heatsink 10 for the mounting of the Integrated Circuit (IC) chip 12. Heatsink 10 has a surface that is electrically conductive. The top of the IC chip 12 is in close physical contact with the heatsink 10 via a thin adhesive layer 18 of thermally conductive epoxy that is deposited over the top surface of cavity 16, the IC die 12 is attached to the heatsink 10 by means of this layer 18. The adhesive layer 18 is cured after the IC die 12 has been inserted into cavity 16. The contact points of the die 12 are conductively bonded, using wire-bonding techniques, to the substrate layer 20.

The bond wires 28 and 30 are shown here as applied for the connection of the IC die 12 to layer 26 of the substrate 20. The substrate 20 has been shown as containing three layers, that is layers 22, 24 and 26. Layer 22 is typically an adhesive layer that directly connects the substrate 20 to the heatsink 10. This establishes the necessary mechanical support for the wire bonding operation. Layer 24 can contain a stiffener that provides rigidity to the substrate 20, while layer 26 contains copper traces and/or circuitry that further interconnects the solder balls 32 to the surrounding circuitry or functional elements. Wires 28 and 30 provide a wire bonded connection between a contact points on the IC die 12 and the copper traces contained in layer 26 of the substrate layer 20.

The substrate 20 contains, as has previously been indicated, the adhesive layer 22, the layer 24 of stiffener for the substrate and the copper traces 26 for interconnect of the IC die 12. In addition, the solder mask layer 27 with openings is deposited over the surface of the substrate 20. Solder mask 27 has been provided with openings that are aligned with the copper traces 26 to provide solder connections between the copper traces 26 and the contact balls 32.

FIG. 1 also shows how the IC die 12 is encapsulated using an encapsulation material that is syringe dispensed to surround the die 12 forming the encapsulation layer 34. It must be noted that this layer not only surrounds the IC die 12 but also covers the bond wires 28 and 30. The encapsulation layer 34 is cured after injection.

For extremely fine pitch packages, where the distance between the contact points of the IC die is very small, an inner lead bonding packages is better suited. Wire bonding requires better access to the bonding contact points and is therefore not suited to extremely fine pitch connections. Wire bonding is typically used for packages with larger pitch interconnects, these packages tend to be more expensive to produce. The wire used during the wire bonding operation also introduces larger parasitic elements into the circuit configuration, resulting in limiting the high end frequency range over which wire-bonded packages can be used.

Solder flux is applied to the balls 32 that need to be attached to the package, the solder balls 32 are then inserted into the solder mask 27. The solder balls 32 are re-flowed by applying heat to the package, excess flux is cleaned from the conductive pads 26 by applying an appropriate cleaning agent. As a final step, the IC package is dry baked, which completes the process of assembling the wire bond package.

For the flip chip/BGA package that has been described, it is important that a solid and dependable ground connection is provided for the ID die 12 of FIG. 1. This common ground is of importance for instance in applications where electrical measurements must be performed on the mounted IC chip 12 after the chip 12 has been mounted on the heatsink 10. Commonality of ground between the IC die 12 and the test system is required for such an application. Not only must there be commonality in the grounding of the test system and the ground point of the chip 12, the commonality must be provided without introducing contact resistance of any significant ohmic value between the ground plane of the IC chip 12 and the surrounding ground plane, in the case of the test example that is the ground plane of the tester. This latter requirement is significant where ohmic resistance of relatively small values is tested, a relatively high value of resistance that is introduced between the ground point of the IC chip 12 and the tester takes on a relatively high value as compared with the (relatively low) value of the resistance that is being evaluated thereby reducing the sensitivity of the test. As an example of such testing can be cited the testing that is performed to evaluate the contact resistance between the connected bond wires (28 and 30 in FIG. 1 as an example) and the copper traces of layer 26 to which these wires are connected. A high resistivity path between the various ground planes (of the IC die 12 and the ground point of the wire traces 26) is unacceptable and must therefore be avoided. In short: the method of assuring commonality between the ground point of the IC chip 12 and the ground point of surrounding electrical circuitry or equipment must provide a low resistivity connection between these two points of ground.

U.S. Pat. No. 6,011,299 (Brench) shows a package using conductive epoxy that has a ground and heatsinks isolated from shields. The Prior art section states that heatsinks are grounded, see column 2.

U.S. Pat. No. 5,376,909 (Nelson et al.) shows a package where the ground plane is the heatsink. Conductive epoxy is also used.

U.S. Pat. No. 5,739,581 (Chillara et al.) shows a package with heat sinks and traces.

SUMMARY OF THE INVENTION

A principle objective of the invention is to provide a low-resistivity connection between a BGA/flip chip that is mounted on a heatsink and the heatsink.

In accordance with the objectives of the invention a new method is provided for the establishment of a low resistivity connection between a wire bonded IC chip that is mounted on a heatsink and the heatsink of the package. A copper trace connection is allocated for this purpose on the surface of the substrate layer to which the IC chip is connected. An opening is provided in the substrate layer of the package, this opening aligns with the copper trace that has been allocated for establishing a ground connection and penetrates the substrate layer down to the surface of the underlying heatsink. The opening is filled with a conductive epoxy or an equivalent low-resistivity material, establishing a direct electrical connection or short between the allocated copper trace and the underlying heatsink. By connecting the ground point of the IC chip to the allocated copper trace, a low resistivity electrical connection is made between the ground point of the IC chip and the heatsink into which the IC chip is mounted thereby providing a common ground point between the flip chip die, the electrical traces to which the flip chip die is connected and the underlying heatsink.

BRIEF DESCRIPTION OF THE DRAWINGS

FIG. 1 shows a cross section of packaging a BGA/flip chip using a heatsink and a Prior Art substrate.

FIG. 2a shows a cross section in an X-direction of a package of a BGA/flip chip using a heatsink and the substrate of the invention.

DESCRIPTION OF THE PREFERRED EMBODIMENTS

Figure 2B:
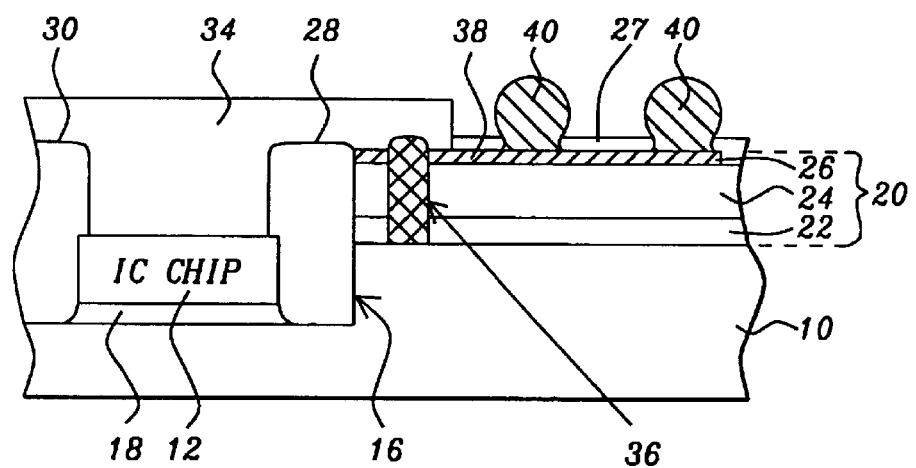
FIG. 2b shows a cross section in an Y-direction of a package of a BGA/flip chip using a heatsink and the substrate of the invention.

FIG. 2a shows a cross section in an X-direction of the package of the invention wherein a IC chip 12 has been mounted within a cavity 16 that has been provided for this purpose in a heatsink 10.

The package of the invention contains the following components:
1) a heatsink 10, heatsink 10 has a surface that is electrically conductive
2) a semiconductor chip or die 12 that takes up the center of the package; the contact points of the die 12 (not shown) are closely spaced around the periphery of the die 12
3) a cavity 16 that is provided in the heatsink 10 for the mounting of the Integrated Circuit (IC) chip 12
4) a thin adhesive layer 18 of thermally conductive epoxy that is deposited over the top surface of cavity 16; the IC die 12 is attached to the heatsink 10 by means of this layer 18. The top of the IC chip 12 is in close physical contact with the heatsink 10 via the adhesive layer 18, layer 18 is cured after the IC die 12 has been inserted into cavity 16
5) a substrate 20 containing three layers, that is layers 22, 24 and 26; the contact points (not shown) of the die 12 are conductively bonded, using wire bonding techniques, to the substrate layer 20
6) layer 22 is typically an adhesive layer that directly connects the substrate layer 20 to the heatsink 10, this establishes the necessary mechanical support for the wire bonding operation
7) layer 24 can contain a stiffener that provides rigidity to the substrate layer 20
8) layer 26 contains copper traces and/or circuitry that interconnect the solder balls of the flip chip package of FIG. 2a to surrounding circuitry or functional elements
9) the solder mask layer 27 with openings that is deposited over the surface of the substrate layer 20; solder mask 27 has been provided with openings that align with the copper traces 26 to provide solder connections between the copper traces 26 and the contact balls 40 of the flip chip package of FIG. 2a
10) wires 28 and 30 that provide a wire-bonded connection between a contact points on the IC die 12 (not shown) and the copper traces contained in layer 26 of the substrate layer 20
11) an encapsulation material 34 that is syringe dispensed to surround the die 12, surrounding the IC die 12 and the bond wires 28 and 30. The encapsulation layer 34 is cured after injection, and
12) BGA contact balls 40.

The design feature of the invention that has been added to the substrate 20 is the via 36 that has been created in the substrate 20. It must be noted that the via 36 is located in the immediate vicinity of the opening 16 in the heatsink 10, thus enabling a short wire bond connection 28 between a ground point on the IC die 12 (not shown) and the heatsink 10.

It must further been noted that the copper trace 38 is dedicated to the establishing of a ground connection between the IC chip 12 and the heatsink 10 of the package of the invention. Via 36 is filled with a low resistivity, high conductivity material such as conductive epoxy or any other suitable material that establishes a low resistivity path between the ground of the IC chip 12 and the heatsink 10.

It must further be emphasized that, where FIG. 2a shows only one via 36, the process of the invention is not limited to one via. A plurality of vias can be provided where this is required thereby establishing a plurality of electrical ground paths between the top surface of substrate 20 and the heatsink 10.

FIG. 2b contains component elements within its cross-section that are identical to the component elements of the package that have previously been highlighted under FIG. 2a. The cross section that is shown in FIG. 2b is a cross section that is taken under an angle that is perpendicular with the cross section that is shown in FIG. 2a. The purpose of the cross section that is shown in FIG. 2b is to indicate that the copper trace 38, which is provided for the establishment of a ground connection between the chip 12 and the heatsink 10, extends perpendicularly from the opening 16 that has been created in the heatsink 10. This perpendicular extension of the copper trace ground connection 38 can therefore be further used to interconnect with contact balls via the solder mask 27 thus further providing a method for connecting a ground of the surrounding circuitry, which is typically connected to the solder balls, to also connect to the heatsink. This latter connection therefore makes a direct interconnect between the ground point of the IC die 12, the surrounding circuitry (not shown) to which the contact balls 40 are connected and the heatsink 10 of the flip chip package. To connect these three separate ground points to one common ground point of reference is important and required for many of the uses and applications for which the flip chip will be applied. The previously cited example of product testing is one of these applications. It is clear that the ultimate circuit functionality will in some cases be dependent on and will therefore benefit from having such a common ground connect point available since this provides one common ground between flip chip 12 and the surrounding circuitry.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A package for packaging an Integrated Circuit die in a cavity provided in a heat sink, comprising:
   an Integrated Circuit die having a ground point, the Integrated Circuit die being a flip chip device;
   a substrate comprising:
      (i) three layers; and
      (ii) an opening there-through for establishment of a ground connection between the Integrated Circuit die and a heat sink;
   a heat sink, the heat sink having a cavity having a bottom surface and sidewalls;
   a first adhesive layer over the bottom surface of the cavity for attaching the IC die to the heat sink;
   the IC die attached to the heat sink by positioning the IC die over the first adhesive layer;
   a plurality of wire bond connections between the IC die and the substrate;
   a conductive material through the opening provided through the substrate;

a wire bond connection between the ground point of said IC die and the conductive material provided through the opening through the substrate;

an encapsulation layer within and adjacent to the cavity for attaching the IC die to the heat sink; and a plurality of attached solder balls.

2. The package of claim 1 wherein said substrate layer comprising a first or lower layer in addition to comprising a second or center layer in addition to comprising a third or upper layer.

3. The package of claim 2, said lower layer comprising:
a first opening, said first opening being aligned with said surface of said bottom of said cavity in said heatsink;
an adhesive layer, said adhesive layer forming an interface between said substrate layer and said heatsink, attaching said substrate layer to said heatsink; and
a second opening, said second opening aligning with matching openings in said center and upper layer.

4. The package of claim 2, said center layer comprising a stiffener comprising a first opening, said first opening being aligned with said surface of said bottom of said cavity in said heatsink, said stiffener further comprising a second opening, said second opening aligning with a matching opening in said lower layer.

5. The package of claim 2, said upper layer comprising: a first opening, said first opening being aligned with said surface of said bottom of said cavity in said heatsink; copper traces with an array of conductive pads, said copper traces forming metal interconnect lines; a solder mask layer having openings having a diameter providing interconnect points between said copper traces and said plurality of solder balls; and a selected electrically conductive pad in said array of conductive pads aligning with said second opening in said upper layer of said substrate layer, said selected electrically conductive pad being located immediately adjacent to said sidewalls of said cavity in said heatsink.

6. The package of claim 2, a second opening in said lower layer of said substrate layer in addition to a second opening in said center layer of said substrate layer in addition to a second opening in said upper layer of said substrate layer being filled with a low resistivity material, establishing electrical contact between said selected electrically conductive pad in said array of conductive pads in said upper layer of said substrate layer and said heatsink.

7. The package of claim 2 with the addition of providing said wire bond connection between said ground point of said IC die and a selected electrically conductive pad in an array of conductive pads in said upper layer of said substrate layer, establishing electrical contact between said ground point of said IC die and said heatsink.

8. The package of claim 1, said heatsink having been provided with a cavity for accommodating said IC die, said cavity having a bottom surface in addition to having two sidewalls, said cavity further being aligned with said opening in said lower layer of said substrate layer in addition to being aligned with said opening in said center layer of said substrate layer in addition to being aligned with said opening in said upper layer of said substrate layer said heatsink having an electrically conductive surface.

9. The package of claim 1, each solder ball of said plurality of solder balls having a diameter approximating the diameter of openings in a solder mask, said solder balls attaching to said solder mask, furthermore said solder balls attaching to electrically conductive traces in said upper layer of said substrate layer.

10. The package of claim 1, said first adhesive layer for attaching said IC die to a stiffener attaching said bottom surface of said Integrated Circuit die to said bottom surface of said cavity in said heatsink whereby said adhesive layer is a thermally conductive layer.

11. The package of claim 1, a second adhesive layer being injected between sidewalls of said IC die and said heatsink thereby including said upper surface of said IC die and further including said wire bond interconnects that are made between said IC die and said substrate layer, said second adhesive layer comprising a thermally conductive epoxy.

12. A package for packaging an Integrated Circuit die in a cavity provided in a heatsink, comprising:
an Integrated Circuit die having ground points;
a substrate layer comprising thre layers and an opening there-through for establishment of a ground connection between the Integrated Circuit die and a heatsink;
a heatsink, said heat sink having a cavity, said cavity having a bottom in addition to having sidewalls, said bottom having a surface;
a first adhesive layer for attaching said IC die to said heatsink;
a second adhesive layer for attaching said IC die to said heatsink;
a plurality of wire bond connections being established between said IC die and said substrate layer; and
a plurality of solder balls.

13. The package of claim 12, said substrate layer comprising a first or lower layer having a plurality of second openings in addition to comprising a second or center layer having a plurality of second openings in addition to comprising a third or upper layer having a plurality of second openings.

14. The package of claim 13, said lower layer comprising: a first opening, said first opening being aligned with said surface or said bottom of said cavity in said heatsink; an adhesive layer, said adhesive layer forming an interface between said substrate layer and said heatsink thereby attaching said substrate layer to said heatsink; and a plurality of second openings aligning with matching openings in said center and upper layer.

15. The package of claim 13, said center layer comprising a stiffener comprising a first opening, said first opening being aligned with said surface of said bottom of said cavity in said heatsink, said stiffener further comprising a plurality of second openings, said plurality of second openings being aligned with matching openings in said lower layer.

16. The package of claim 13, said upper layer comprising: a first opening, said first opening being aligned with said surface of said bottom of said cavity in said heatsink; copper traces with an array of conductive pads, said copper traces forming metal interconnect lines; a solder mask layer having openings having a diameter, providing interconnect points between said copper traces and said plurality of solder balls; and a plurality of selected electrically conductive pads in an array of conductive pads aligning with said plurality of second openings in said upper layer of said substrate layer, said selected electrically conductive pads being located immediately adjacent to said sidewalls of said cavity in said heatsink.

17. The package of claim 13, said plurality of second openings in said lower layer of said substrate layer in addition to said plurality of second openings in said center layer of said substrate layer in addition to said plurality of second openings in said upper layer of said substrate layer being filled with a low resistivity material, establishing electrical contact points between said plurality of selected electrically conductive pads in said array of conductive pads in said upper layer of said substrate layer and said heatsink.

18. The package of claim 16 with the addition of providing said plurality of wire bond connections between said ground points of said IC die and said selected plurality of electrically conductive pads in said array of conductive pads in said upper layer of said substrate layer, thereby establishing a plurality of electrical contacts between said ground points of said IC die and said heatsink.

19. The package of claim 12, said heatsink comprising a cavity for accommodating said IC die, said cavity having a bottom surface in addition to having sidewalls, said cavity further being aligned with said first opening in said lower layer of said substrate layer in addition to being aligned with said first opening in said center layer of said substrate layer in addition to being aligned with said first opening in said upper layer of said substrate layer, said heatsink having an electrically conductive surface.

20. The package of claim 12, each solder ball of said plurality of solder balls having a diameter approximating the diameter of said openings in said solder mask, said solder balls attaching to said solder mask, furthermore said solder balls attaching to said electrically conductive traces in said upper layer of said substrate layer.

21. The package of claim 12, said first adhesive layer for attaching said IC die to said stiffener attaching said bottom surface of said Integrated Circuit die to said bottom surface of said cavity in said heatsink, said first adhesive layer being a thermally conductive layer.

22. The package of claim 12, said second adhesive layer being injected between sidewalls of said IC die and said heatsink including said upper surface of said IC die and further including said wire bond interconnects being made between said IC die and said substrate layer, said second adhesive layer comprising a thermally conductive epoxy.

* * * * *

UNITED STATES PATENT AND TRADEMARK OFFICE
CERTIFICATE OF CORRECTION

| | | |
|---|---|---|
| PATENT NO. | : 6,828,671 B2 | Page 1 of 1 |
| APPLICATION NO. | : 10/323447 | |
| DATED | : December 7, 2004 | |
| INVENTOR(S) | : Aquien et al. | |

It is certified that error appears in the above-identified patent and that said Letters Patent is hereby corrected as shown below:

<u>Title page</u>:   INID (57), Abstract section, please replace the Abstract with the following:

A new method is provided for a low resistivity connection between a wire bonded IC chip that is mounted on a heatsink and the heatsink of the package. A copper trace connection for this purpose is on the surface of the substrate to which the IC chip is connected. An opening is in the substrate, which aligns with the copper trace for establishing a ground connection and penetrates the substrate of the underlying heatsink. The opening is filled with a conductive epoxy establishing a direct electrical connection between the allocated copper trace and the underlying heatsink. By connecting the ground point of the IC chip to the allocated copper trace, a direct electrical low resistivity connection is made between the ground point of the IC chip and the heatsink into which the IC chip is mounted.

<u>Column 7</u>:

Line 33, delete "said second opening" and insert therefor --a second opening--

<u>Column 8</u>:

Line 13, delete "thre" and insert therefor --three--

Line 34, delete "or" and insert therefor --of--

Signed and Sealed this

Twenty-fifth Day of November, 2008

JON W. DUDAS
*Director of the United States Patent and Trademark Office*